(12) United States Patent
Park et al.

(10) Patent No.: US 7,915,150 B2
(45) Date of Patent: Mar. 29, 2011

(54) METHOD OF MANUFACTURING NITRIDE SEMICONDUCTOR SUBSTRATE USING EPITAXIAL GROWTH

(75) Inventors: Sung-soo Park, Seongnam-si (KR); Dae-ho Yoon, Suwon-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 169 days.

(21) Appl. No.: 12/216,743

(22) Filed: Jul. 10, 2008

(65) Prior Publication Data

US 2009/0191695 A1    Jul. 30, 2009

(30) Foreign Application Priority Data

Jan. 25, 2008   (KR) .................. 10-2008-0008030

(51) Int. Cl.
  *H01L 21/20* (2006.01)
  *H01L 21/36* (2006.01)
(52) U.S. Cl. .. 438/483; 438/486; 438/493; 257/E21.097
(58) Field of Classification Search .................. 438/493, 438/483, 486; 257/E21.097
  See application file for complete search history.

(56) References Cited

U.S. PATENT DOCUMENTS

| 4,959,136 A * | 9/1990 | Hatwar ............... 204/192.15 |
| 6,783,602 B2 * | 8/2004 | Gray ........................ 134/10 |
| 2003/0133851 A1 * | 7/2003 | Kitahara ................. 422/186 |
| 2008/0223434 A1 * | 9/2008 | Ikenoue et al. ........... 136/252 |

OTHER PUBLICATIONS

S.B. Aldabergenova et al. "Structure changes of AlN:Ho films with annealing and enhancement of the Ho3+ emission", 2006, Journal of Non-Crustalline Solids 352 (2006) 1290-1293.*

* cited by examiner

*Primary Examiner* — David S Blum
(74) *Attorney, Agent, or Firm* — Harness, Dickey & Pierce, PLC

(57) ABSTRACT

A method of manufacturing a nitride semiconductor substrate according to example embodiments may include forming a buffer layer on a (100) plane of a silicon (Si) substrate. The buffer layer may have a hexagonal crystal system and a (1010) plane. A nitride semiconductor layer may be epitaxially grown on the buffer layer. The nitride semiconductor layer may have a (1010) plane. Accordingly, because example embodiments enable the use of a relatively inexpensive Si substrate, a more economical nitride semiconductor substrate having a relatively large diameter may be achieved.

20 Claims, 3 Drawing Sheets

METHOD OF MANUFACTURING NITRIDE SEMICONDUCTOR SUBSTRATE USING EPITAXIAL GROWTH

PRIORITY STATEMENT

This application claims priority under 35 U.S.C. §119 to Korean Patent Application No. 10-2008-0008030, filed on Jan. 25, 2008 in the Korean Intellectual Property Office (KIPO), the entire contents of which are incorporated herein by reference.

BACKGROUND

1. Technical Field

Example embodiments relate to a method of manufacturing a nitride semiconductor substrate.

2. Description of the Related Art

The use of nitride (e.g., gallium nitride (GaN)) semiconductors in the electronics industry is expected to increase because of the beneficial physical and chemical properties of such semiconductors. Unlike a silicon (Si) semiconductor or a gallium arsenide (GaAs) semiconductor, a GaN semiconductor has a direct transition type bandgap structure, wherein the bandgap can be controlled to be 1.9-6.2 eV using an indium (In) or aluminum (Al) alloy. Consequently, a GaN semiconductor has utility as an optical device. Additionally, because GaN has a high breakdown voltage and is stable at high temperatures, it is also useful as a material for various devices (e.g., high output devices, high temperature electronic devices) which have been difficult to realize using conventional materials. Examples of these devices are large-sized electric signs using a full color display, traffic lights, light sources of an optical recording medium, and high output transistors of an automobile engine.

A conventional GaN-based semiconductor device (e.g., nitride semiconductor laser diode) is formed on a c-plane GaN substrate. However, the c-plane is also known as a polar plane, wherein the bonding probability of electrons and holes may be decreased by the influence of an internal electric field generated by polarization. As a result, the luminescence efficiency of a laser diode may be decreased. To solve this problem, in the prior art, a semiconductor device is realized by epitaxially growing an a-plane GaN on an r-plane of sapphire. However, the cost of the r-plane of sapphire is relatively high. Furthermore, because the lattice mismatch between a (1120) plane of the r-plane sapphire substrate and a (1100) plane of the a-plane GaN is about 16.2% (which is relatively high), a defect may be created by the strains in the a-plane GaN layer that is stacked on the r-plane of the sapphire.

SUMMARY

Example embodiments relate to a method of manufacturing a relatively high-quality nitride semiconductor substrate at a lower cost. For instance, example embodiments relate to a method of manufacturing a buffer layer for growing a non-polar gallium nitride (GaN) epitaxial layer (m-plane) on a silicon (Si) substrate.

A method of manufacturing a nitride semiconductor substrate according to example embodiments may include forming a buffer layer on a (100) plane of a silicon substrate. The buffer layer may have a hexagonal crystal system and a (1010) plane. A nitride semiconductor layer may be epitaxially grown on the buffer layer. The nitride semiconductor layer may have a (1010) plane.

The method of manufacturing a nitride semiconductor substrate according to example embodiments may further include cleaning the silicon substrate with an ultrasonic wave cleaning process prior to forming the buffer layer. The ultrasonic wave cleaning process may include sequentially cleaning the silicon substrate with hydrofluoric acid (HF), trichloroethylene (TCE), and ethanol.

The buffer layer may include a nitride. The nitride may be at least one of aluminum nitride (AlN), titanium nitride (TiN), hafnium nitride (HfN), gallium nitride (GaN), indium nitride (InN), and zirconium nitride (ZrN). Forming the buffer layer may include forming an amorphous layer and crystallizing the amorphous layer by performing an annealing process. The amorphous layer may be formed using a physical vapor deposition (PVD) method. The annealing of the amorphous layer may be performed at a temperature of about 900-950° C. Additionally, the annealing process may be performed for about 30-60 minutes. The buffer layer may be formed to a thickness of about 200-1500 Å.

The temperature of the Si substrate may be kept at a temperature of about 100° C. or less while the buffer layer is being formed. A precursor for the physical vapor deposition method may be a relatively pure metal or a nitride. During annealing, the atmospheric gas may be nitrogen ($N_2$) or ammonia ($NH_3$) gas. When the atmospheric gas is ammonia gas, the ammonia gas may be injected at a temperature of about 600° C.

The nitride semiconductor layer may include a group 3 element. The group 3 element may be at least one of aluminum (Al), gallium (Ga), and indium (In). For instance, the buffer layer may include AlN, and the nitride semiconductor layer may include GaN.

A method of manufacturing a nitride semiconductor substrate according to example embodiments may also include depositing an amorphous AlN layer on a (100) plane of a Si substrate. An AlN crystalline layer having a (1010) plane may be formed by annealing the amorphous AlN layer. A GaN layer having a (1010) plane may be epitaxially grown on the AlN crystalline layer.

The method of manufacturing a nitride semiconductor substrate according to example embodiments may further include cleaning the silicon substrate with an ultrasonic wave cleaning process prior to depositing the amorphous AlN layer. The ultrasonic wave cleaning process may include sequentially cleaning the silicon substrate with hydrofluoric acid, trichloroethylene, and ethanol.

The amorphous AlN layer may be deposited with a physical vapor deposition method. The annealing of the amorphous AlN layer may be performed at a temperature of about 900-950° C. Additionally, the annealing of the amorphous AlN layer may be performed for about 30-60 minutes. The AlN crystalline layer may be formed to a thickness of about 200-1500 Å.

BRIEF DESCRIPTION OF THE DRAWINGS

The above and other features of example embodiments may become more apparent upon review of the attached drawings, in which.

DETAILED DESCRIPTION OF EXAMPLE EMBODIMENTS

Figure 1:
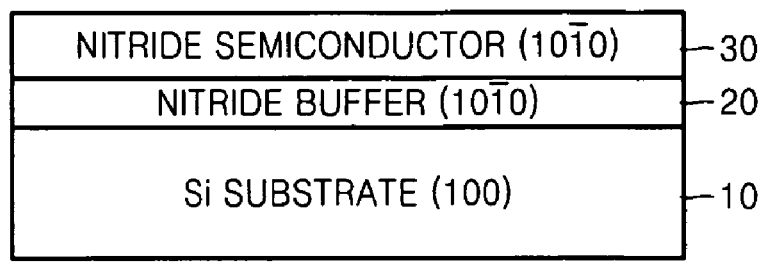
FIG. 1 is a cross-sectional view of a nitride semiconductor substrate according to example embodiments.

It will be understood that when an element or layer is referred to as being "on", "connected to", "coupled to", or "covering" another element or layer, it may be directly on, connected to, coupled to, or covering the other element or layer or intervening elements or layers may be present. In contrast, when an element is referred to as being "directly on," "directly connected to," or "directly coupled to" another element or layer, there are no intervening elements or layers present. Like numbers refer to like elements throughout the specification. As used herein, the term "and/or" includes any and all combinations of one or more of the associated listed items.

It will be understood that, although the terms first, second, third, etc. may be used herein to describe various elements, components, regions, layers, and/or sections, these elements, components, regions, layers, and/or sections should not be limited by these terms. These terms are only used to distinguish one element, component, region, layer, or section from another element, component, region, layer, or section. Thus, a first element, component, region, layer, or section discussed below could be termed a second element, component, region, layer, or section without departing from the teachings of example embodiments.

Spatially relative terms, e.g., "beneath," "below," "lower," "above," "upper," and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the term "below" may encompass both an orientation of above and below. The device may be otherwise oriented (rotated 90 degrees or at other orientations) and the spatially relative descriptors used herein interpreted accordingly. Likewise, the terms "front," "back," "bottom," and/or "top" may be used merely for convenience of description and are not limited to any one position or spatial orientation unless otherwise noted.

The terminology used herein is for the purpose of describing various embodiments only and is not intended to be limiting of example embodiments. As used herein, the singular forms "a," "an," and "the" are intended to include the plural forms as well, unless the context clearly indicates otherwise. Additionally, the suffix "(s)" as used herein is intended to include both the singular and the plural of the term that it modifies, thereby encompassing one or more of that term (e.g., "layer(s)" includes one or more layers). It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments are described herein with reference to cross-sectional illustrations that are schematic illustrations of idealized embodiments (and intermediate structures) of example embodiments. As such, variations from the shapes of the illustrations as a result, for example, of manufacturing techniques and/or tolerances, are to be expected. Thus, example embodiments should not be construed as limited to the shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of example embodiments. Furthermore, the relative sizes of elements and/or regions in the drawings may have been exaggerated for clarity.

Unless otherwise defined, all terms (including technical and scientific terms) used herein have the same meaning as commonly understood by one of ordinary skill in the art to which example embodiments belong. It will be further understood that terms, including those defined in commonly used dictionaries, should be interpreted as having a meaning that is consistent with their meaning in the context of the relevant art and will not be interpreted in an idealized or overly formal sense unless expressly so defined herein.

The endpoints of all ranges directed to the same component or property are inclusive of the endpoint and independently combinable. For example, ranges of "up to about 25 wt. %, more specifically, about 5 wt. % to about 20 wt. %" are inclusive of the endpoints and all intermediate values of the ranges of "about 5 wt. % to about 25 wt. %." The modifier "about" used in connection with a quantity is inclusive of the stated value and has the meaning dictated by the context (e.g., the degree of error associated with the measurement of the particular quantity).

Example embodiments relate to a method of manufacturing a nitride semiconductor substrate having a relatively large diameter at lower costs by using a silicon (Si) substrate. A method of manufacturing a nitride semiconductor substrate according to example embodiments may include forming a (1010) nitride buffer layer on a (100) plane of a Si substrate and growing a (1010) nitride semiconductor layer on the (1010) nitride buffer layer.

FIG. 1 is a cross-sectional view of a nitride semiconductor substrate according to example embodiments. Referring to FIG. 1, the nitride semiconductor substrate may include a Si substrate 10, a nitride buffer layer 20, and a nitride semiconductor layer 30. The nitride buffer layer 20 and nitride semiconductor layer 30 may be sequentially stacked on a (100) plane of the Si substrate 10.

The nitride buffer layer 20 may be formed on the (100) plane of the Si substrate 10. The nitride semiconductor layer 30 may be grown on the (1010) plane of the nitride buffer layer 20. The Si substrate 10 with the (100) plane may have a relatively large diameter and may also be less expensive than the SiC substrate or sapphire substrate used for manufacturing conventional nitride semiconductors.

The nitride buffer layer 20 may include at least one of aluminum nitride (AlN), titanium nitride (TiN), hafnium nitride (HfN), gallium nitride (GaN), indium nitride (InN), zirconium nitride (ZrN), or other nitrides where a hexagonal crystal system and a (1010) plane may be realized. For example, the nitride buffer layer 20 may be formed of AlN. The nitride buffer layer 20 may be formed by depositing AlN, TiN, HfN, GaN, InN, and/or ZrN to obtain an amorphous layer. The deposition may be performed with a physical vapor deposition (PVD) method. The thickness of the amorphous layer may be controlled within a range of about 200-1500 Å. During deposition, the substrate 10 may be kept at a relatively low temperature (e.g., about 100° C. or less). A relatively pure metal or a nitride may be used as a precursor for the physical vapor deposition method.

The amorphous layer may be crystallized by performing an annealing process. For example, the amorphous layer may be annealed at a temperature of about 900-950° C. for about 30-60 minutes. Nitrogen ($N_2$) or ammonia ($NH_3$) gas may be used as an atmospheric gas. For example, ammonia gas may be injected into the deposition chamber while maintaining the temperature of the deposition chamber at about 600° C.

Prior to depositing the amorphous layer, the Si (100) substrate may be cleaned to remove undesired materials (e.g., oxide layers, organic materials), thereby reducing factors that may have a negative impact on epitaxial growth. The cleaning process may include various ultrasonic wave cleaning operations using different cleaning agents. For example, hydrofluoric acid (HF) may be used in a first cleaning operation, trichloroethylene (TCE) may be used in a second cleaning operation, and ethanol may be used in a third cleaning operation. As a result, natural oxide layers and/or organic materials in the Si substrate may be removed.

An amorphous aluminum nitride (AlN) layer may be deposited on the (100) plane of the Si substrate using a PVD method (e.g., a sputtering method). The thickness of the amorphous AlN layer may be controlled to be about 200-1500 Å. The amorphous AlN layer may be annealed at about 900-950° C. for about 30-60 minutes. When the annealing time is too short or the temperature is too low, sufficient crystallization may not be achieved. On the other hand, if the annealing time is too long or the temperature is too high, the amorphous AlN layer may be shifted away from an m-plane (a quasi-stable crystallization structure) to a c-plane (a stable crystallization structure). Thus, it may be beneficial for the annealing temperature and time to be controlled properly. Consequently, the priority growth direction of the AlN crystals may be directed to the m-plane by crystallizing while controlling the annealing time and temperature.

Figure 2A:
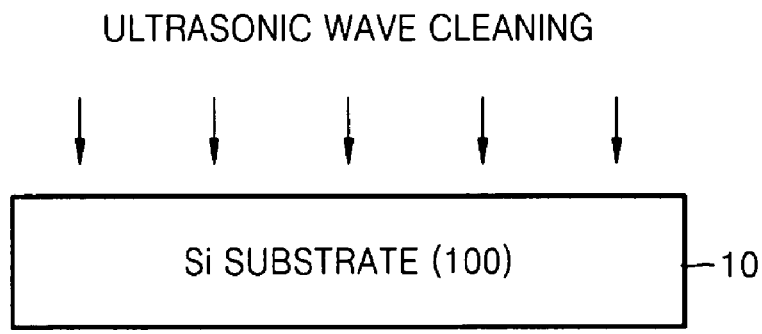
FIGS. 2A through 2C illustrate a method of manufacturing a nitride semiconductor substrate according to example embodiments.
Figure 2B:
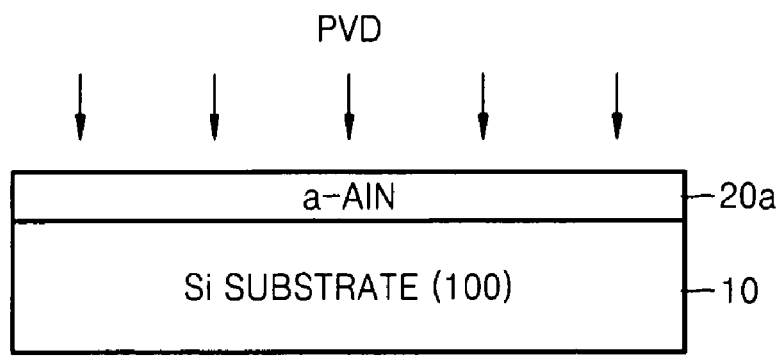
Figure 2C:
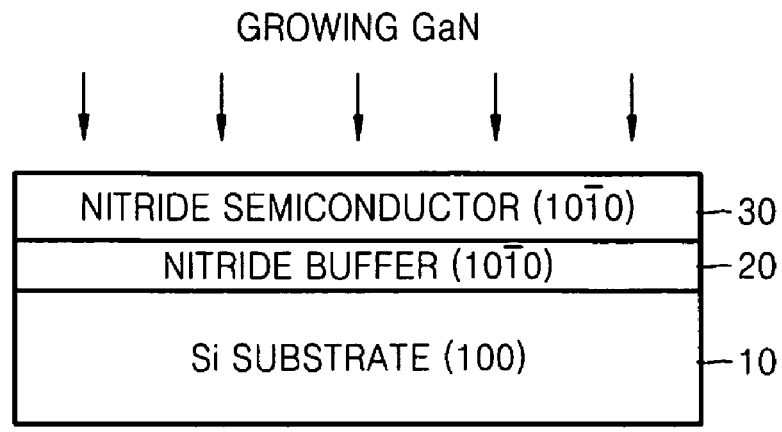

FIGS. 2A through 2C illustrate a method of manufacturing a nitride semiconductor substrate according to example embodiments. Referring to FIG. 2A, a Si substrate 10 may be wet cleaned to remove oxides and/or organic materials. For example, natural oxide layers on a plane of the Si substrate 10 may be removed using HF, and organic materials on a plane of the Si substrate 10 may be removed using TCE and ethanol. Each operation may be performed for about 10 minutes by ultrasonic wave cleaning.

Referring to FIG. 2B, an amorphous AlN (a-AlN) layer 20a may be deposited using a PVD method on the (100) plane of the Si substrate 10. Before depositing AlN, a dry cleaning process using argon plasma may be performed for about 10 minutes at about 100 mtorr. The PVD method may be a radio frequency (RF) sputtering method. For example, the RF sputtering may be performed at about 40° C. or less and at a base pressure of about $7 \times 10^{-7}$ torr or less, wherein nitrogen and argon may be mixed at a ratio of about 2:3 to generate plasma. An Al target may be used to form the amorphous AlN buffer layer 20a to a thickness of about 100 nm on the Si substrate 10. The amorphous AlN buffer layer 20a may be crystallized by annealing in a nitrogen atmosphere so as to achieve an m-plane AlN buffer layer 20 having a hexagonal crystal system and a (1010) plane. The annealing process may be performed at a temperature of about 900-950° C. for about 30-60 minutes.

Referring to FIG. 2C, a GaN semiconductor layer 30 may be obtained by crystallizing and growing GaN on the AlN buffer layer 20. The GaN may be grown using a conventional method. Accordingly, a relatively inexpensive m-plane GaN having a relatively large diameter may be formed on the Si substrate 10.

Figure 3:
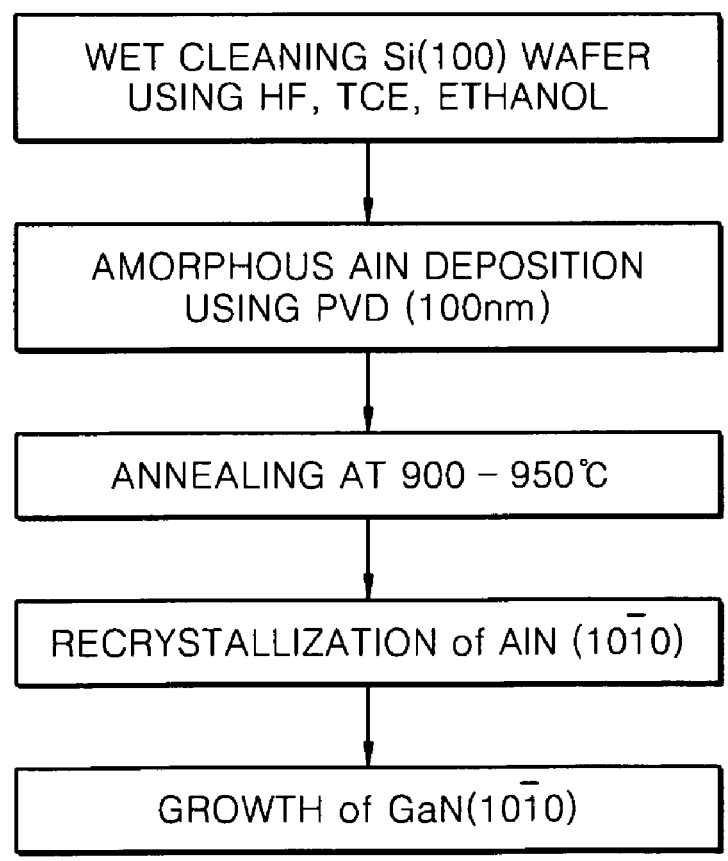
FIG. 3 is a flowchart illustrating a method of manufacturing a nitride semiconductor substrate according to example embodiments.
Figure 4:
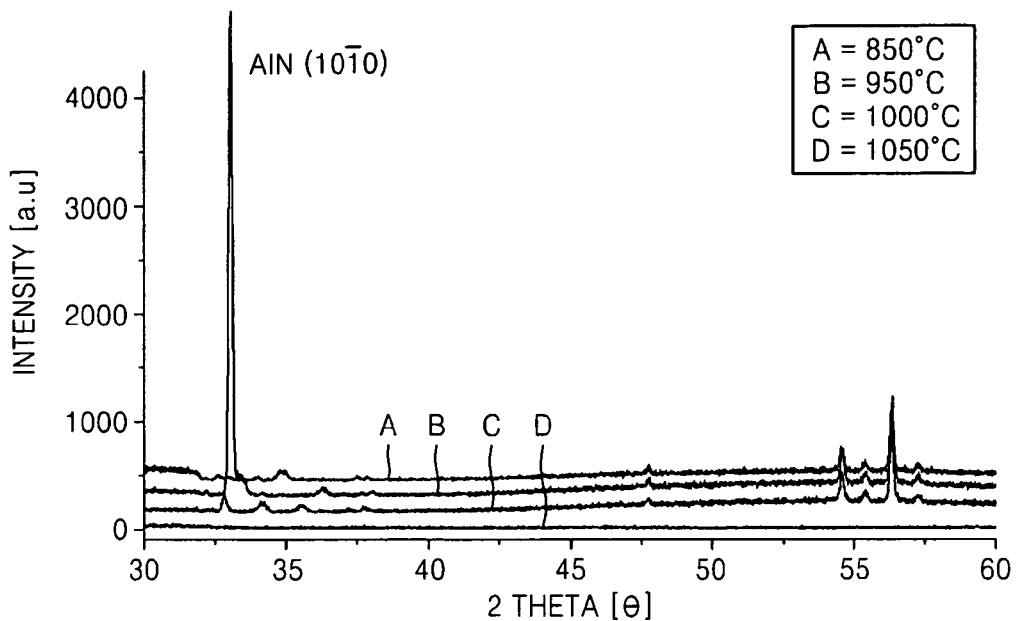
FIG. 4 illustrates X-ray diffraction (XRD) patterns of an AlN crystallographic layer at different annealing temperatures according to example embodiments.

FIG. 3 is a flowchart illustrating a method of manufacturing a nitride semiconductor substrate as described with reference to FIGS. 2A through 2C FIG. 4 illustrates X-ray diffraction (XRD) patterns of an AlN crystallographic layer at different annealing temperatures according to example embodiments. Referring to FIG. 4, a peak for AlN (1010) is shown at 950° C., while such a distinct peak is not observed at other temperatures. Thus, as shown by FIG. 4, AlN (1010) may be obtained by using an annealing process at a temperature of about 900-950° C.

Figure 5:
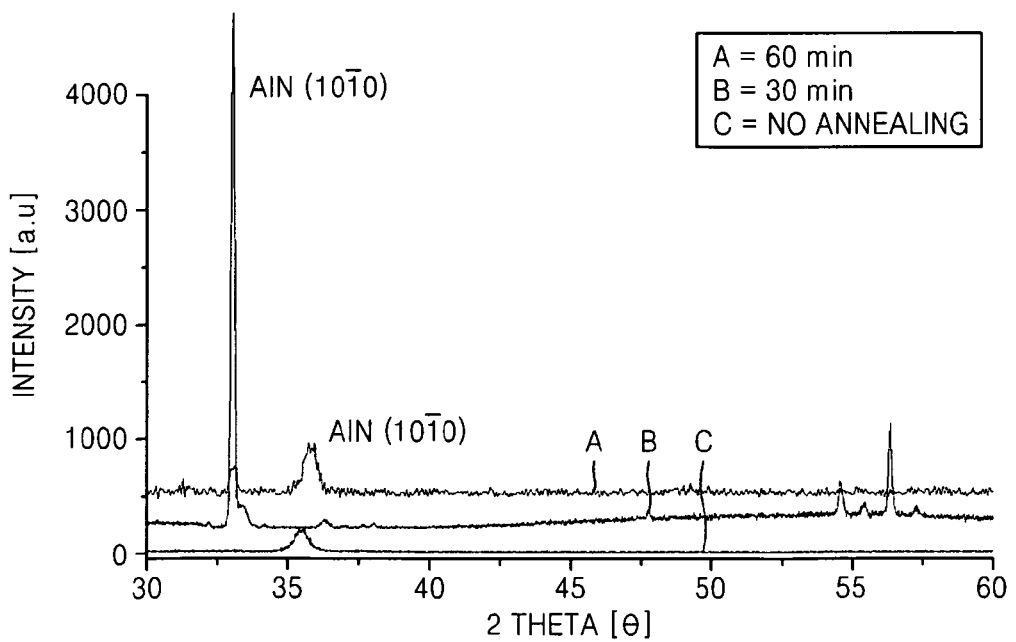
FIG. 5 illustrates XRD patterns of an AlN crystallographic layer at different annealing times according to example embodiments.

FIG. 5 illustrates XRD patterns of an AlN crystallographic layer at different annealing times according to example embodiments. Referring to FIG. 5, at an annealing temperature of about 900-950° C., peaks for AlN (1010) are observed at annealing times of 60 and 30 minutes, while such a peak is not observed when annealing was not performed. Thus, AlN (1010) may be obtained at an annealing temperature of about 900-950° C. and an annealing time of about 30-60 minutes. However, it should be understood that the annealing temperature and/or the annealing time may depend on the thickness of the AlN buffer layer.

As described above, when a nitride semiconductor layer (e.g., GaN) is grown on a nitride buffer layer, an m-plane non-polar GaN (1010) may be obtained. The nitride buffer layer may be formed of AlN, TiN, HfN, GaN, InN, and/or ZrN. The nitride semiconductor layer grown on the nitride buffer layer may be formed of a group 3 element. The group 3 element may include at least one of aluminum (Al), gallium (Ga), and indium (In).

While example embodiments have been disclosed herein, it should be understood that other variations may be possible. Such variations are not to be regarded as a departure from the spirit and scope of example embodiments of the present application, and all such modifications as would be obvious to one skilled in the art are intended to be included within the scope of the following claims.

What is claimed is:

1. A method of manufacturing a nitride semiconductor substrate, comprising:
    forming a buffer layer on a (100) plane of a silicon substrate, the buffer layer having a hexagonal crystal system and a (1010) plane, the (1010) plane of the buffer layer being parallel to the (100) plane of the silicon substrate; and
    epitaxially growing a nitride semiconductor layer on the (1010) plane of the buffer layer, the nitride semiconductor layer having a (1010) plane, the (1010) plane of the nitride semiconductor layer being parallel to the (1010) plane of the buffer layer.

2. The method of claim 1, further comprising:
    cleaning the silicon substrate with an ultrasonic wave cleaning process prior to forming the buffer layer.

3. The method of claim 2, wherein the ultrasonic wave cleaning process includes sequentially cleaning the silicon substrate with hydrofluoric acid, trichloroethylene, and ethanol.

4. The method of claim 1, wherein the buffer layer includes a nitride.

5. The method of claim 4, wherein the nitride is at least one of AlN, TiN, HfN, GaN, InN, and ZrN.

6. The method of claim 1, wherein forming the buffer layer includes
   forming an amorphous layer, and
   crystallizing the amorphous layer by performing an annealing process.

7. The method of claim 6, wherein the silicon substrate is maintained at a temperature of about 100° C. or less when forming the amorphous layer.

8. The method of claim 6, wherein the amorphous layer is formed to a thickness of about 200-1500 Å.

9. The method of claim 6, wherein the amorphous layer is formed by deposition.

10. The method of claim 9, wherein the deposition is achieved with a physical vapor deposition method.

11. The method of claim 10, wherein the physical vapor deposition method uses a relatively pure metal or a nitride as a precursor.

12. The method of claim 10, wherein the physical vapor deposition method is a radio frequency sputtering method.

13. The method of claim 6, wherein the amorphous layer is an amorphous AlN layer.

14. The method of claim 13, wherein the amorphous AlN layer is annealed to form a crystalline AlN layer.

15. The method of claim 6, wherein the annealing process is performed at a temperature of about 900-950° C.

16. The method of claim 6, wherein the annealing process is performed for about 30-60 minutes.

17. The method of claim 6, wherein the annealing process is performed in the presence of nitrogen gas or ammonia gas.

18. The method of claim 1, wherein the nitride semiconductor layer includes a group 3 element.

19. The method of claim 18, wherein the group 3 element is at least one of aluminum, gallium, and indium.

20. The method of claim 1, wherein the buffer layer includes AlN, and the nitride semiconductor layer includes GaN.

* * * * *